United States Patent
Shohji

(10) Patent No.: US 10,847,744 B2
(45) Date of Patent: Nov. 24, 2020

(54) LIGHT EMITTING ELEMENT, DISPLAY DEVICE, AND ELECTRONIC APPARATUS

(71) Applicant: Sony Semiconductor Solutions Corporation, Kanagawa (JP)

(72) Inventor: Reijiroh Shohji, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/494,118

(22) PCT Filed: Jan. 24, 2018

(86) PCT No.: PCT/JP2018/002100
§ 371 (c)(1),
(2) Date: Sep. 13, 2019

(87) PCT Pub. No.: WO2018/173465
PCT Pub. Date: Sep. 27, 2018

(65) Prior Publication Data
US 2020/0044181 A1 Feb. 6, 2020

(30) Foreign Application Priority Data
Mar. 21, 2017 (JP) .................. 2017-054296

(51) Int. Cl.
*H01L 51/52* (2006.01)
*H01L 51/56* (2006.01)
*H01L 27/32* (2006.01)

(52) U.S. Cl.
CPC ...... *H01L 51/5218* (2013.01); *H01L 51/5209* (2013.01); *H01L 27/3246* (2013.01);
(Continued)

(58) Field of Classification Search
CPC ............ H01L 51/5218; H01L 51/5209; H01L 27/3246; H01L 2251/558; H01L 27/3283; H01L 51/56; H01L 2251/5315
See application file for complete search history.

(56) References Cited

U.S. PATENT DOCUMENTS

| | | | |
|---|---|---|---|
| 2001/0009280 A1* | 7/2001 | Tanaka ................ | H01L 27/3244 257/59 |
| 2003/0156239 A1* | 8/2003 | Inoue ................ | G02F 1/133553 349/113 |
| 2010/0133998 A1* | 6/2010 | Nishikawa .......... | H01L 51/5268 313/505 |

FOREIGN PATENT DOCUMENTS

| | | |
|---|---|---|
| JP | 2010-056017 A | 3/2010 |
| JP | 2014-044793 A | 3/2014 |

(Continued)

*Primary Examiner* — Karen Kusumakar
(74) *Attorney, Agent, or Firm* — Michael Best & Friedrich LLP

(57) ABSTRACT

To provide a light emitting element, a display device, and an electronic apparatus, less influenced by light emitted outside a light emitting region.

A light emitting element includes: a light emitting region formed on a plane; a transparent electrode formed in a planar region that is larger than the light emitting region and internally includes the light emitting region; a reflector disposed under the transparent electrode and formed in the planar region inside the light emitting region; an organic light emitting layer disposed on the transparent electrode and formed so as to extend to the outside of the light emitting region; and a counter electrode disposed on the organic light emitting layer and formed so as to extend to the outside of the light emitting region.

20 Claims, 7 Drawing Sheets

(52) U.S. Cl.
CPC .......... *H01L 27/3283* (2013.01); *H01L 51/56* (2013.01); *H01L 2251/5315* (2013.01); *H01L 2251/558* (2013.01)

(56) References Cited

FOREIGN PATENT DOCUMENTS

| WO | 2006/104256 A1 | 10/2006 |
| WO | 2014/107007 A1 | 7/2014 |
| WO | 2015/125308 A1 | 8/2015 |

* cited by examiner

LIGHT EMITTING ELEMENT, DISPLAY DEVICE, AND ELECTRONIC APPARATUS

TECHNICAL FIELD

The present disclosure relates to a light emitting element, a display device, and an electronic apparatus.

BACKGROUND ART

In recent years, a display device using an organic electroluminescent element (so-called organic EL element) as a light emitting element is becoming widespread. The organic EL element is a self-emission type light emitting element that emits light by low voltage direct current drive, and is formed, for example, by laminating an organic layer including a light emitting layer or the like between an anode and a cathode.

For example, Patent Document 1 below discloses a display device in which an electroluminescent element (also referred to as an EL element) having a laminated structure of a first electrode layer, a light emitting layer, and a second electrode layer is disposed on a first substrate, and the EL element is sealed by a second substrate disposed so as to face the first substrate. Furthermore, the display device disclosed in Patent Document 1 has an opening defining insulating film having an opening region smaller than a planar region of a lower electrode of the EL element around the EL element in order to define a display region of the EL element.

CITATION LIST

Patent Document

Patent Document 1: Japanese Patent Application Laid-Open No. 2014-44793

SUMMARY OF THE INVENTION

Problems to be Solved by the Invention

However, in the display device disclosed in Patent Document 1, depending on the film thickness, the shape, and the like of the opening defining insulating film, unintended light emission may occur outside the display region defined by the opening defining insulating film or the like. In such a case, a chromaticity point of light emitted from a light emitting element is shifted by mixture of light emitted outside the display region.

Therefore, the present disclosure proposes a novel and improved light emitting element, display device, and electronic apparatus capable of reducing an influence on the chromaticity point due to light emitted outside the light emitting region.

Solutions to Problems

The present disclosure provides a light emitting element including: a light emitting region formed on a plane; a transparent electrode formed in a planar region that is larger than the light emitting region and internally includes the light emitting region; a reflector disposed under the transparent electrode and formed in the planar region inside the light emitting region; an organic light emitting layer disposed on the transparent electrode and formed so as to extend to the outside of the light emitting region; and a counter electrode disposed on the organic light emitting layer and formed so as to extend to the outside of the light emitting region.

Furthermore, the present disclosure provides a display device including: a plurality of light emitting elements arranged in an array on a plane, the plurality of light emitting elements including: a plurality of light emitting regions formed apart from each other on the plane; a transparent electrode formed in a planar region that is larger than each of the light emitting regions and internally includes each of the light emitting regions; a reflector disposed under the transparent electrode and formed in the planar region inside each of the light emitting regions; an organic light emitting layer disposed on the transparent electrode and formed so as to extend to an adjacent light emitting region; and a counter electrode disposed on the organic light emitting layer and formed so as to extend to an adjacent light emitting region; and a control unit that controls light emission of the plurality of light emitting elements.

Furthermore, the present disclosure provides an electronic apparatus including: a plurality of light emitting elements arranged in an array on a plane, the plurality of light emitting elements including: a plurality of light emitting regions formed apart from each other on the plane; a transparent electrode formed in a planar region that is larger than each of the light emitting regions and internally includes each of the light emitting regions; a reflector disposed under the transparent electrode and formed in the planar region inside each of the light emitting regions; an organic light emitting layer disposed on the transparent electrode and formed so as to extend to an adjacent light emitting region; and a counter electrode disposed on the organic light emitting layer and formed so as to extend to an adjacent light emitting region; and a control unit that controls light emission of the plurality of light emitting elements.

The present disclosure can suppress light extraction efficiency outside a light emitting region by preventing light emitted outside the light emitting region from being reflected to the counter electrode side.

Effects of the Invention

As described above, the present disclosure can reduce an influence of light emitted outside a light emitting region.

Note that the above effect is not necessarily limited. Any one of effects described in the present specification or another effect that can be grasped from the present specification may be exhibited together with the above effect or in place of the above effect.

MODE FOR CARRYING OUT THE INVENTION

Figure 1A:
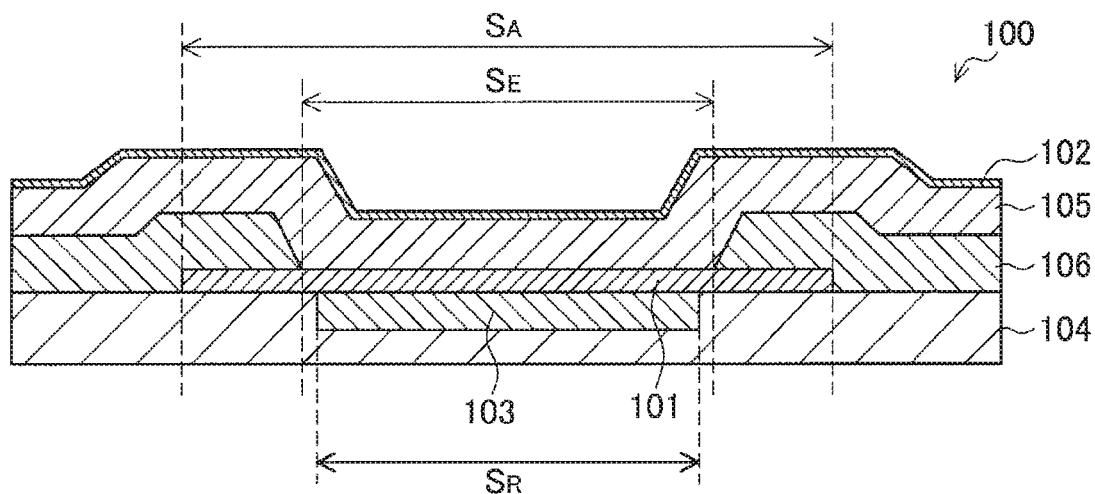
FIG. 1A is a cross-sectional view schematically illustrating a laminated structure of a light emitting element according to an embodiment of the present disclosure.

A preferable embodiment of the present disclosure will be described in detail below with reference to the accompanying drawings. Note that in the present specification and the drawings, the same reference numerals are given to constituent elements having substantially the same functional configuration, and redundant explanation is omitted.

Note that the description will be made in the following order.

1. Configuration of light emitting element
2. Modification of light emitting element
2.1. First modification
2.2. Second modification
2.3. Third modification
3. Method for manufacturing light emitting element
3.1. First manufacturing method
3.2. Second manufacturing method
4. Application example of light emitting element <1. Configuration of Light Emitting Element>

Figure 1B:
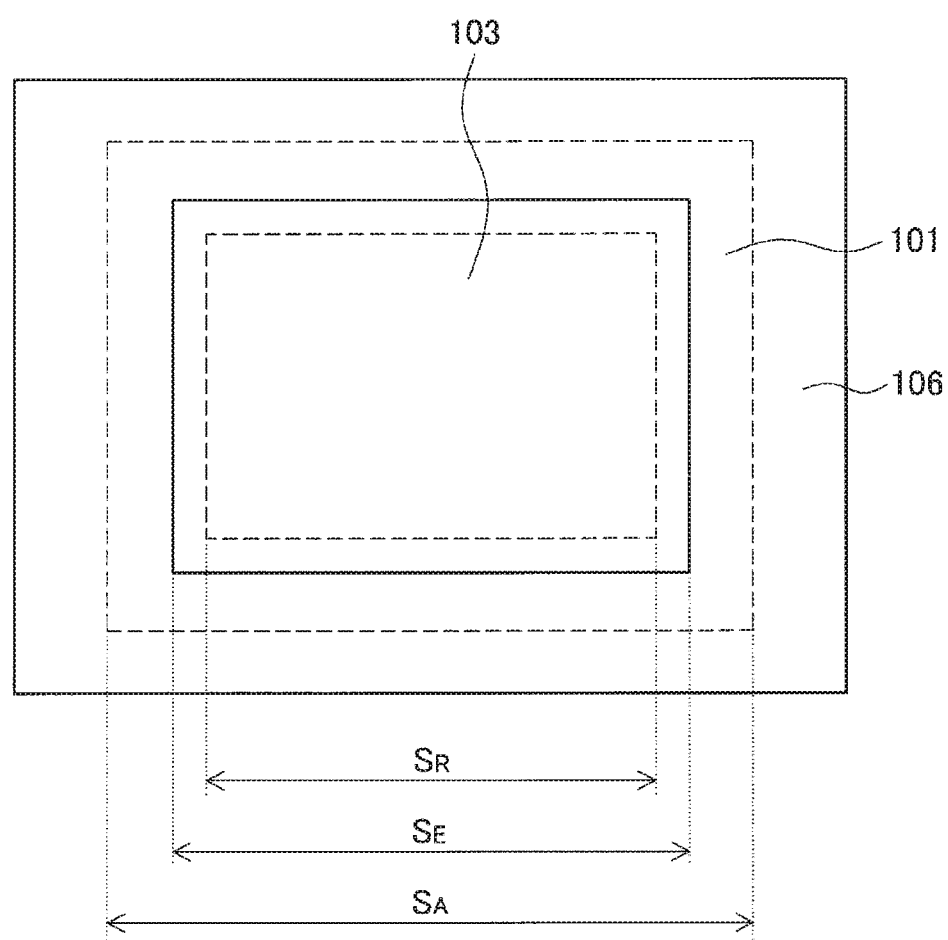
FIG. 1B is a plan view for explaining a relationship among planar regions in which a reflector, a transparent electrode, and a region defining film are formed in FIG. 1A.

First, with reference to FIGS. 1A and 1B, a configuration of a light emitting element according to an embodiment of the present disclosure will be described. FIG. 1A is a cross-sectional view schematically illustrating a laminated structure of a light emitting element according to an embodiment of the present disclosure. FIG. 1B is a plan view for explaining a relationship among planar regions in which a reflector, a transparent electrode, and a region defining film are formed in FIG. 1A. Note that in the present specification, a lamination direction of layers in the light emitting element is expressed as a vertical direction, a side on which a transparent electrode 101 is disposed is expressed as a lower side, and a side on which a counter electrode 102 is disposed is expressed as an upper side.

As illustrated in FIGS. 1A and 1B, a light emitting element 100 according to the present embodiment includes an insulating layer 104, a reflector 103 embedded in the insulating layer 104, the transparent electrode 101 disposed on the insulating layer 104, a region defining film 106 disposed around the transparent electrode 101, an organic light emitting layer 105 disposed on the transparent electrode 101 and the region defining film 106, and the counter electrode 102 disposed on the organic light emitting layer 105.

The insulating layer 104 internally includes various elements and wiring (not illustrated) electrically connected to the light emitting element 100, and supports the light emitting element 100. Specifically, the insulating layer 104 may be a multilayer wiring layer disposed on a semiconductor substrate (not illustrated) such as a monocrystalline, polycrystalline, or amorphous silicon (Si) substrate. Furthermore, inside the insulating layer 104, a control circuit (not illustrated) that controls driving of the light emitting element 100, wiring (not illustrated) that electrically connects a terminal of the control circuit to the transparent electrode 101 of the light emitting element 100, and the like may be disposed.

The insulating layer 104 can be formed, for example, by using any one of a silicon oxide ($SiO_x$)-based material (for example, $SiO_2$, BPSG, PSG, BSG, AsSG, PbSG, SiON, SOG, low melting point glass, glass paste, or the like), a silicon nitride ($SiN_x$)-based material, a silicon oxynitride (SiON)-based material, and an insulating resin (for example, a polyimide resin, a novolak resin, an acrylic resin, polybenzoxazole, or the like) singly or in combination of two or more types thereof. Note that the insulating layer 104 can be constituted by a known material other than the above-described materials as long as having an insulating property.

The region defining film 106 is formed around the transparent electrode 101 so as to partially overlap with a top surface of the transparent electrode 101 using an insulating material to define a light emitting region $S_E$. Specifically, as illustrated in FIG. 1B, the region defining film 106 is disposed on the insulating layer 104 and the transparent electrode 101 so as to have an opening for exposing a part of the transparent electrode 101, and the opening serves as the light emitting region $S_E$. In the light emitting element 100, an electric field is applied to the organic light emitting layer 105 between the transparent electrode 101 and the counter electrode 102 through the opening formed in the region defining film 106, and the organic light emitting layer 105 thereby emits light. In other words, the region defining film 106 can define the light emitting region $S_E$ in which the organic light emitting layer 105 emits light.

For example, in a case where a plurality of the light emitting elements 100 is arranged in an array on a substrate, the region defining film 106 defines the light emitting region $S_E$ of each of the light emitting elements 100, and thereby can define a pixel region corresponding to each of the light emitting elements 100. Therefore, in such a case, the region defining film 106 functions as a pixel defining film.

Furthermore, the region defining film 106 is formed so as to partially overlap with a top surface of the transparent electrode 101, and therefore can cover a side surface of the transparent electrode 101. In such a case, the region defining film 106 can improve an electrical insulating property between the side surface of the transparent electrode 101 and the transparent electrode 101 of an adjacent light emitting element 100, and therefore can suppress generation of a leak current between adjacent light emitting elements 100.

The region defining film 106 can be formed, for example, by using any one of a silicon oxide ($SiO_x$)-based material (for example, $SiO_2$, BPSG, PSG, BSG, AsSG, PbSG, SiON, SOG, low melting point glass, glass paste, or the like), a silicon nitride ($SiN_x$)-based material, a silicon oxynitride ($SiON$)-based material, and an insulating resin (for example, a polyimide resin, a novolak resin, an acrylic resin, polybenzoxazole, or the like) singly or in combination of two or more types thereof. The region defining film 106 can be constituted by a known material other than the above-described materials as long as having an insulating property, and may be constituted by the same material as the insulating layer 104 or may be constituted by a different material from the insulating layer 104.

The reflector 103 is disposed so as to be embedded in the insulating layer 104, and reflects light emitted from the organic light emitting layer 105. Specifically, as illustrated in FIG. 1A, the reflector 103 is disposed under the transparent electrode 101 so as to be embedded in the insulating layer 104. The reflector 103 reflects a light beam passing through the transparent electrode 101 and incident on the reflector 103 among light beams emitted from the organic light emitting layer 105, and thereby can improve light extraction efficiency from the counter electrode 102 side of the light emitting element 100.

Furthermore, as illustrated in FIG. 1B, the reflector 103 is formed in a planar region $S_R$ inside the light emitting region $S_E$ when viewed in a lamination direction of the light emitting element 100. Specifically, the reflector 103 is disposed in a region inside the light emitting region $S_E$ with a planar area that is the same as or smaller than the light emitting region $S_E$ defined by the region defining film 106 in the plane of the insulating layer 104.

With this configuration, even if unintended light emission occurs outside the light emitting region $S_E$ and light is emitted from the organic light emitting layer 105, the reflector 103 is not disposed outside the light emitting region $S_E$, and therefore light is not reflected. Therefore, such a reflector 103 can reduce an influence of light emitted outside the light emitting region $S_E$.

The reflector 103 may be constituted by any material or structure as long as being able to reflect light, but for example, may be constituted by a metal material such as aluminum (Al), an aluminum neodymium alloy (AlNd), or an aluminum magnesium alloy (for example, ACX manufactured by Mitsui Mining & Smelting Co., Ltd.). Furthermore, the reflector 103 may be constituted by a dielectric material having a refractive index lower than the transparent electrode 101. In such a case, the reflector 103 can totally reflect a part of light incident on the reflector 103 from the transparent electrode 101 due to a difference in refractive index. Moreover, the reflector 103 may reflect incident light by being formed as a reflecting structure such as a dichroic mirror including a dielectric multilayer film or a diffraction grating having a minute uneven structure.

The transparent electrode 101 functions as an anode of the light emitting element 100, and is formed planarly on the insulating layer 104 as a transparent electrode with high light transmittance. Specifically, the transparent electrode 101 may be constituted by a material having a high work function such that a total light transmittance measured by a haze meter or the like is 70% or more. With this configuration, since the transparent electrode 101 can transmit light emitted from the organic light emitting layer 105 without confining the light, the light extraction efficiency from the light emitting element 100 can be improved.

Furthermore, as illustrated in FIG. 1B, the transparent electrode 101 is formed in a planar region $S_A$ which is larger than the light emitting region $S_E$ and internally includes the light emitting region $S_E$ when viewed in a lamination direction of the light emitting element 100. With this configuration, the transparent electrode 101 can be easily aligned with the region defining film 106 that defines the light emitting region $S_E$.

The transparent electrode 101 may be constituted by, for example, a transparent conductive oxide such as indium zinc oxide (IZO), indium tin oxide (ITO), tin oxide ($SnO_2$), or zinc oxide (ZnO). Furthermore, the transparent electrode 101 may be constituted by a metal or an alloy having a high work function as a metal film having such a thin thickness (for example, 20 nm or less) as to have light transmittance.

Note that power is supplied to the transparent electrode 101 by connecting wiring (not illustrated) inside the insulating layer 104 to the transparent electrode 101. Furthermore, in a case where the reflector 103 is constituted by a metal material, the transparent electrode 101 is electrically conductive with the reflector 103. Therefore, by connection of the wiring (not illustrated) inside the insulating layer 104 to the reflector 103, power may be supplied to the transparent electrode 101.

The organic light emitting layer 105 contains a light emitting material, and is disposed on the transparent electrode 101 so as to extend to the outside of the light emitting region $S_E$. The organic light emitting layer 105 emits light by application of an electric field between the transparent electrode 101 and the counter electrode 102. For example, the organic light emitting layer 105 may be formed by a multilayer structure obtained by laminating a plurality of functional layers, and may be formed by a multilayer structure obtained by sequentially laminating a hole injection layer, a hole transport layer, a light emitting layer, an electron transport layer, and an electron injection layer from the transparent electrode 101 side. Furthermore, the organic light emitting layer 105 may be formed by a so-called tandem type structure in which a plurality of light emitting layers is connected to one another via a charge generation layer or an intermediate electrode.

The hole injection layer is a layer that contains a hole injection material and enhances injection efficiency of holes from the transparent electrode 101. As the hole injection material, a known material can be used. Examples of the hole injection material include triphenylamine-containing polyether ketone (TPAPEK), 4-isopropyl-4'-methyldiphenyliodonium tetrakis(pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4', 4"-tris(3-methylphenylphenylamino) triphenylamine (m-MTDATA), N,N'-di(1-naphthyl)-N,N'-diphenylbenzidine (NPB), 4,4',4"-tris(diphenylamino) triphenylamine (TDATA), 4,4',4"-tris(N,N-2-naphthylphenylamino) triphenylamine (2-TNATA), and the like.

The hole transport layer is a layer that contains a hole transport material and enhances transport efficiency of holes from the transparent electrode 101. As the hole transport material, a known material can be used. Examples of the hole transport material include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof. More specific examples of the hole transport material include α-naphthylphenylphenylenediamine (α-NPD), porphyrin, metal tetraphenylporphyrin, metal naphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino) triphenylamine, N,N,N',N'-tetrakis(p-tolyl) p-phenylenediamine, N,N,N',N'-tetraphenyl-4,4'-diaminobiphenyl, N-phenylcarbazole, 4-di-p-tolylamino stilbene, and the like.

The light emitting layer is a layer that converts electric energy into light energy, contains at least one or more of a hole transport material, an electron transport material, and a both charge transport material as host materials, and contains a fluorescent or phosphorescent organic light emitting material as a dopant material As the host material, a known charge transport material can be used. Examples of the host material include a styryl derivative, an anthracene derivative, a naphthacene derivative, a carbazole derivative, an aromatic amine derivative, a phenanthroline derivative, a triazole derivative, a quinolinolato-based metal complex, a phenanthroline derivative, and the like.

As the dopant material, a known fluorescent material and phosphorescent material can be used. Examples of the fluorescent material include a dye material such as a styryl benzene-based dye, an oxazole-based dye, a perylene-based dye, a coumarin-based dye, or an acridine-based dye, a polyaromatic hydrocarbon-based material such as an anthracene derivative, a naphthacene derivative, a pentacene derivative, or a chrysene derivative, a pyrromethene skeleton material, a quinacridone-based derivative, a cyanomethylenepyran-based derivative, a benzothiazole-based derivative, a benzimidazole-based derivative, a metal chelated oxinoid compound, and the like. For example, as the phosphorescent material, an organometallic complex containing at least one metal selected from the group consisting of ruthenium (Ru), rhodium (Rh), palladium (Pd), silver (Ag), rhenium (Re), osmium (Os), iridium (Ir), platinum (Pt), and gold (Au) can be used. More specific examples of the phosphorescent material include a complex having a noble metal element such as Ir as a central metal, such as $Ir(ppy)_3$, a complex such as $Ir(bt)_2.acac_3$, and a complex such as $PtOEt_3$.

Furthermore, the light emitting layer may emit light corresponding to each color constituting a pixel of the display device in place of white light. For example, a red light emitting layer that emits red light can be formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi) Furthermore, a green light emitting layer that emits green light can be formed by mixing 5% by mass of coumarin 6 with DPVBi. Moreover, a blue light emitting layer that emits blue light can be formed by mixing 2.5% by mass of 4,4'-bis[2-{4-(N,N-diphenylamino) phenyl}vinyl] biphenyl (DPAVBi) with DPVBi.

The electron transport layer is a layer that contains an electron transport material and enhances injection efficiency of electrons from the counter electrode 102.

As the electron transport material, a known material can be used. Examples of the electron transport material include tris(8-quinolinolato) aluminum ($Alq_3$) and a compound having a nitrogen-containing aromatic ring. More specific examples of the electron transport material include the above-described tris(8-quinolinolato) aluminum ($Alq_3$), 2,9-dimethyl-4,7-diphenyl-1,10-phenanthroline (BCP), and bathophenanthroline (Bphen). Note that the electron transport layer may be constituted by a plurality of layers. In a case where the electron transport layer is formed by a plurality of layers, the electron transport layer may further contain a layer doped with an alkali metal element or an alkaline earth metal element.

The electron injection layer is a layer that enhances injection efficiency of electrons from the counter electrode 102. As the electron injection layer, a known electron injection material can be used. Examples of the electron injection material include lithium fluoride (LiF), sodium chloride (NaCl), cesium fluoride (CsF), lithium oxide ($Li_2O$), barium oxide (BaO), and the like.

The counter electrode 102 functions as a cathode of the light emitting element 100, and is disposed on the organic light emitting layer 105 so as to extend to the outside of the light emitting region $S_E$. Furthermore, the counter electrode 102 is constituted by a material having a low work function as a transparent electrode having high light transmittance. As a result, the counter electrode 102 transmits light emitted from the organic light emitting layer 105 and light emitted from the organic light emitting layer 105 and then reflected by the reflector 103, and the light extraction efficiency from the light emitting element 100 can be thereby improved. The counter electrode 102 may be formed, for example, such that the total light transmittance measured by a haze meter or the like is 70% or more.

The counter electrode 102 may be constituted by, for example, a metal or an alloy having a low work function, such as aluminum (Al), silver (Ag), magnesium (Mg), calcium (Ca), sodium (Na), strontium (Sr), an alloy of an alkali metal and silver, an alloy of an alkaline earth metal and silver, an alloy of magnesium and calcium, or an alloy of aluminum and lithium as a metal film having such a thin thickness (for example, 20 nm or less) as to have light transmittance. Furthermore, the counter electrode 102 may be constituted by a transparent conductive oxide such as indium zinc oxide (IZO), indium tin oxide (ITO), tin oxide ($SnO_2$), or zinc oxide (ZnO), and may be formed as a laminated electrode of a layer containing the above-described metal or alloy having a low work function and a layer containing a transparent conductive oxide.

Note that a substrate on which the plurality of light emitting elements 100 is arranged in an array functions as a display device by further disposing a protective layer, a planarization film, a color filter, a counter substrate, and the like on the counter electrode 102. The display device can display an image by controlling light emission of each of the plurality of light emitting elements 100. Such a display device functions as a so-called top-emission type display device that extracts light emitted from the light emitting element 100 from the counter electrode 102 (in other words, counter substrate) side.

Figure 2A:
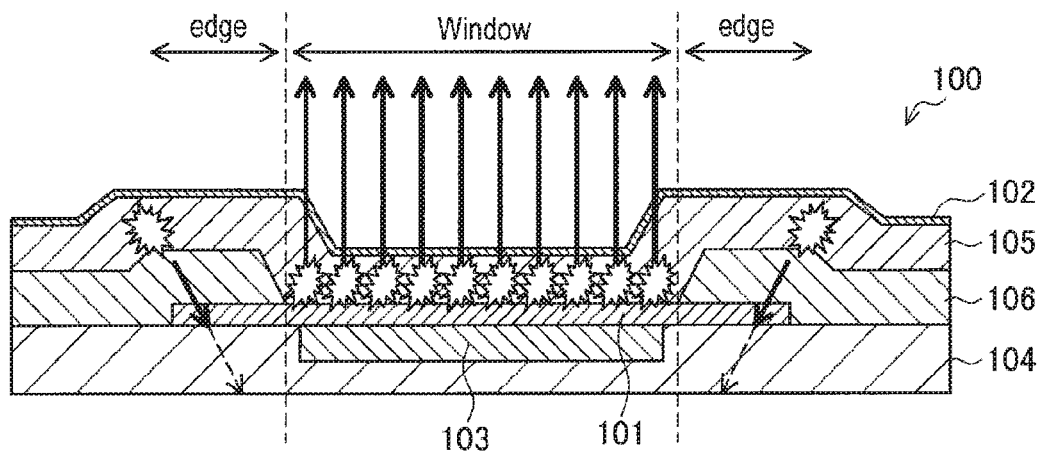
FIG. 2A is a cross-sectional view for explaining a behavior of a light beam emitted from the light emitting element according to the embodiment.
Figure 2B:
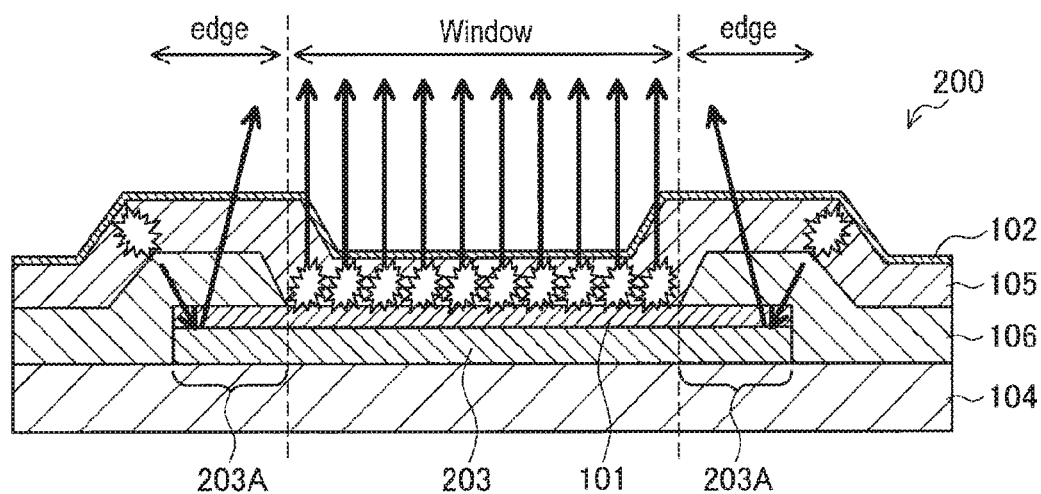
FIG. 2B is a cross-sectional view for explaining a behavior of a light beam emitted from a light emitting element according to a comparative example.

Here, with reference to FIGS. 2A and 2B, an effect of the light emitting element 100 according to the present embodiment will be described. FIG. 2A is a cross-sectional view for explaining a behavior of a light beam emitted from the light emitting element 100 according to the present embodiment. FIG. 2B is a cross-sectional view for explaining a behavior of a light beam emitted from a light emitting element 200 according to a comparative example. Note that in FIGS. 2A and 2B, a region indicated by "Window" (hereinafter referred to as "Window region") corresponds to the light emitting region $S_E$.

First, as illustrated in FIG. 2B, in the light emitting element 200 according to a comparative example, a reflector 203 is formed so as to have substantially the same size as the transparent electrode 101. This is because the reflector 203 and the transparent electrode 101 can be easily patterned by laminating the reflector 203 and the transparent electrode 101 and then simultaneously etching the reflector 203 and the transparent electrode 101. Furthermore, this is for preventing generation of a difference in level in the laminated structure of the reflector 203 and the transparent electrode 101 due to a difference in size between the reflector 203 and the transparent electrode 101.

However, in the light emitting element 200, the transparent electrode 101 is formed also in a region indicated by "edge" (hereinafter referred to as an edge region) outside the Window region, and therefore the organic light emitting layer 105 may emit light even in the edge region due to electric field concentration or the like. A light beam incident on the insulating layer 104 among light beams emitted in the edge region is reflected by an end portion 203A of the reflector 203. Therefore, in the light emitting element 200, light emitted in the edge region is also visible like light emitted in the Window region, and affects a chromaticity point of the light emitting element 200. Note that electric field concentration easily occurs at a portion where the organic light emitting layer 105 is bent. Therefore, at end portions of the reflector 203 and the transparent electrode 101 where a difference in level is easily generated, electric field concentration easily occurs, and unintended light emission also easily occurs from the organic light emitting layer 105.

Meanwhile, as illustrated in FIG. 2A, in the light emitting element 100 according to the present embodiment, the reflector 103 is formed so as to be smaller than the transparent electrode 101 and smaller than the opening of the region defining film 106.

Therefore, in the light emitting element 100, the reflector 103 is not disposed in the edge region. Therefore, even in a case where the organic light emitting layer 105 emits light in the edge region due to electric field concentration or the like, light emitted in the edge region is not reflected by the reflector 103, and goes straight to the insulating layer 104 side. With this configuration, the light emitting element 100 can suppress light extraction in the edge region while improving light extraction efficiency in the Window region by controlling a region in which the reflector 103 is formed. Therefore, the light emitting element 100 can reduce an influence of unintended light emitted outside the light emitting region $S_E$.

Furthermore, in the light emitting element 100, the reflector 103 is formed so as to be embedded in the insulating layer 104. In such a case, in the light emitting element 100, the transparent electrode 101 can be formed planarly on the insulating layer 104. Therefore, even in a case where the size of the reflector 103 is different from that of the transparent electrode 101, a generated difference in level can be reduced. With this configuration, the light emitting element 100 can reduce the frequency and size of bending of the organic light emitting layer 105. Therefore, light emission outside the light emitting region $S_E$ due to electric field concentration can be further suppressed.

As described above, the light emitting element 100 according to the present embodiment can reduce an influence of light emitted in an unintended region by suppressing the extraction efficiency of light emitted outside the light emitting region $S_E$ defined by the region defining film 106.

<2. Modification of Light Emitting Element>

Subsequently, modifications of the light emitting element according to the present embodiment will be described with reference to FIGS. 3 to 5. The light emitting element 100 according to the present embodiment can have such configurations as in the following first to third modifications, for example.

(2.1. First Modification)

First, a configuration of a light emitting element 110 according to the first modification will be described with reference to FIG. 3. FIG. 3 is a cross-sectional view schematically illustrating a laminated structure of the light emitting element 110 according to the first modification.

Figure 3:
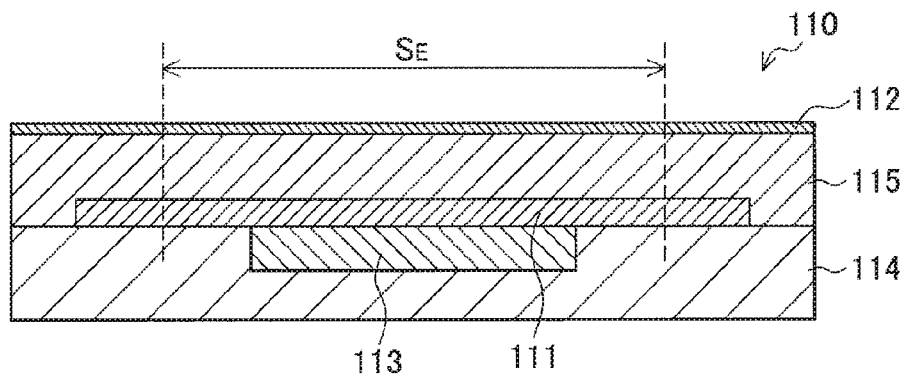
FIG. 3 is a cross-sectional view schematically illustrating a laminated structure of a light emitting element according to a first modification.

As illustrated in FIG. 3, the light emitting element 110 according to the first modification includes an insulating layer 114, a reflector 113 embedded in the insulating layer 114, a transparent electrode 111 disposed on the insulating layer 114, an organic light emitting layer 115 disposed on the transparent electrode 111 and the insulating layer 114, and a counter electrode 112 disposed on the organic light emitting layer 115.

In other words, the light emitting element 110 according to the first modification is different from the light emitting element 100 illustrated in FIG. 1A in that the region defining film 106 is not disposed. In the light emitting element 110, the organic light emitting layer 115 can be formed more planarly than in the light emitting element 100 illustrated in FIG. 1A, and therefore occurrence of abnormal light emission due to electric field concentration can be suppressed. Note that a material of each component illustrated in FIG. 3 is substantially similar to the material of each component of the same name in FIG. 1A, and therefore description thereof will be omitted here.

In the light emitting element 110, the transparent electrode 111 is formed in a planar region larger than a planar region in which the reflector 113 is formed. Note that a boundary defining the light emitting region $S_E$ may be set, for example, between an end portion of the transparent electrode 111 and an end portion of the reflector 113.

In the light emitting element 110, electric field concentration relatively easily occurs at an end portion of the transparent electrode 111. Therefore, abnormal light emission that emits strong light easily occurs at the end portion of the transparent electrode 111. Therefore, in the light emitting element 110, the planar region of the reflector 113 is smaller than the planar region of the transparent electrode 111 to prevent reflection of light by the reflector 113 at the end portion of the transparent electrode 111, and the light extraction efficiency outside the light emitting region $S_E$ is thereby reduced. With this configuration, the light emitting element 110 can reduce an influence of the abnormal light emission occurring at the end portion of the transparent electrode 111.

(2.2. Second Modification)

Next, a configuration of a light emitting element 120 according to the second modification will be described with reference to FIG. 4. FIG. 4 is a cross-sectional view schematically illustrating a laminated structure of the light emitting element 120 according to the second modification.

Figure 4:
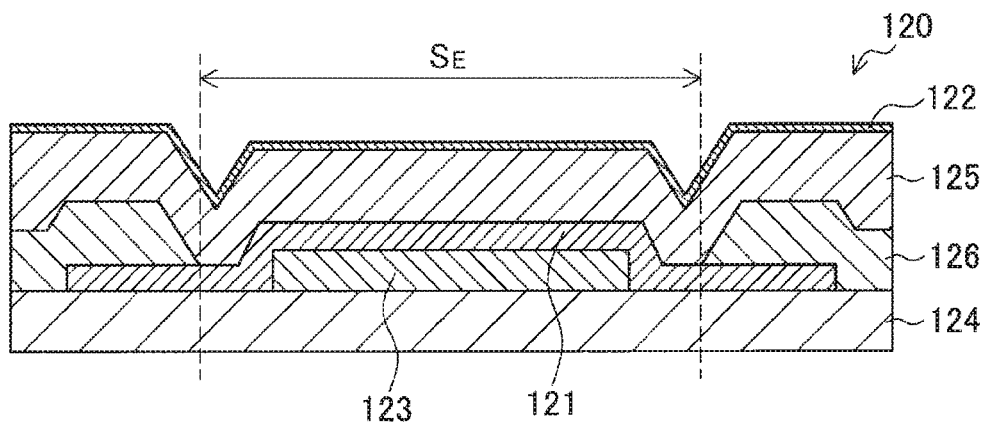
FIG. 4 is a cross-sectional view schematically illustrating a laminated structure of a light emitting element according to a second modification.

As illustrated in FIG. 4, the light emitting element 120 according to the second modification includes an insulating layer 124, a reflector 123 disposed on the insulating layer 124, a transparent electrode 121 disposed on the insulating layer 124 and the reflector 123, a region defining film 126 disposed around the transparent electrode 121, an organic light emitting layer 125 disposed on the transparent electrode 121 and the insulating layer 124, and a counter electrode 122 disposed on the organic light emitting layer 125.

In other words, the light emitting element 120 according to the second modification is different from the light emitting element 100 illustrated in FIG. 1A in that the reflector 123 is disposed on the insulating layer 124 and the transparent electrode 121 is formed so as to cover the reflector 123. The light emitting element 120 can be manufactured more easily than the light emitting element 100 illustrated in FIG. 1A. Note that a material of each component illustrated in FIG. 4 is substantially similar to the material of each component of the same name in FIG. 1A, and therefore description thereof will be omitted here.

In the light emitting element 120, the transparent electrode 121 is formed so as to cover the reflector 123, and is formed in a planar region larger than a planar region in which the reflector 123 is formed. Furthermore, the reflector 123 is formed in a planar region inside an opening end of the region defining film 126. Note that the light emitting region $S_E$ may be set to a planar region in which an opening is formed in the region defining film 126.

In the light emitting element 120, electric field concentration relatively easily occurs due to a difference in level of the region defining film 126 outside the light emitting region $S_E$, and abnormal light emission easily occurs due to electric field concentration. Therefore, in the light emitting element 120, the planar region of the reflector 123 is smaller than the planar region of the transparent electrode 121 to prevent reflection of light by the reflector 123 outside the light emitting region $S_E$, and the light extraction efficiency outside the light emitting region $S_E$ is thereby reduced. With this configuration, the light emitting element 120 can reduce an influence of the abnormal light emission occurring at the end portion of the transparent electrode 121.

(2.3. Third Modification)

Subsequently, a configuration of a light emitting element 130 according to the third modification will be described with reference to FIG. 5. FIG. 5 is a cross-sectional view schematically illustrating a laminated structure of the light emitting element 130 according to the third modification.

Figure 5:
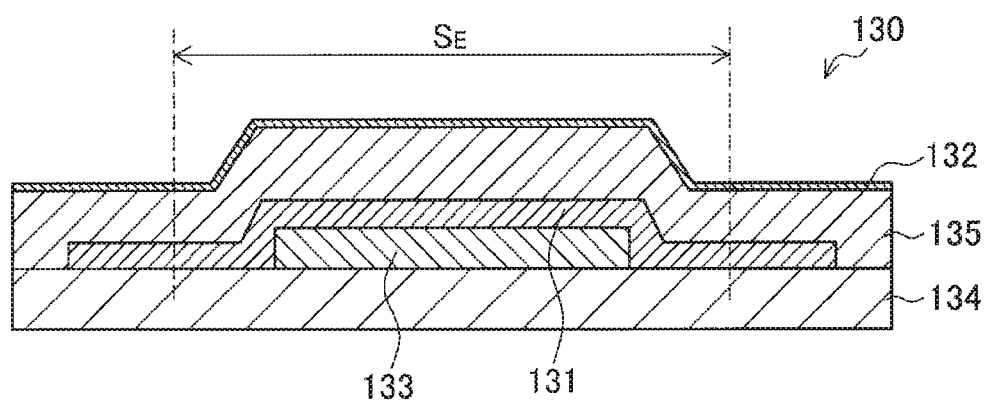
FIG. 5 is a cross-sectional view schematically illustrating a laminated structure of a light emitting element according to a third modification.

As illustrated in FIG. 5, the light emitting element 130 according to the third modification includes an insulating layer 134, a reflector 133 disposed on the insulating layer 134, a transparent electrode 131 disposed on the insulating layer 134 and the reflector 133, an organic light emitting layer 135 disposed on the transparent electrode 131 and the insulating layer 134, and a counter electrode 132 disposed on the organic light emitting layer 135.

In other words, the light emitting element 130 according to the third modification is different from the light emitting element 120 illustrated in FIG. 4 in that the region defining film 126 is not disposed. In the light emitting element 130, the organic light emitting layer 135 can be formed with less bending than in the light emitting element 120 illustrated in FIG. 4, and therefore occurrence of abnormal light emission due to electric field concentration can be further suppressed. Note that a material of each component illustrated in FIG. 5 is substantially similar to the material of each component of the same name in FIG. 1A, and therefore description thereof will be omitted here.

In the light emitting element 130, the transparent electrode 131 is formed so as to cover the reflector 133, and is formed in a planar region larger than a planar region in which the reflector 133 is formed. Note that a boundary defining the light emitting region $S_E$ may be set, for example, between an end portion of the transparent electrode 131 and an end portion of the reflector 133.

In the light emitting element 130, electric field concentration relatively easily occurs at an end portion of the transparent electrode 131. Therefore, abnormal light emission that emits strong light easily occurs at the end portion of the transparent electrode 131. Therefore, in the light emitting element 130, the planar region of the reflector 133 is smaller than the planar region of the transparent electrode 131 to prevent reflection of light by the reflector 133 at the end portion of the transparent electrode 131, and the light extraction efficiency outside the light emitting region $S_E$ is thereby reduced. With this configuration, the light emitting element 130 can reduce an influence of the abnormal light emission occurring at the end portion of the transparent electrode 131.

<3. Method for Manufacturing Light Emitting Element>

Subsequently, a method for manufacturing the light emitting element 100 according to the present embodiment will be described with reference to FIGS. 6A to 6E and 7A to 7D. The light emitting element 100 according to the present embodiment can be manufactured by, for example, the following first or second manufacturing method.

(3.1. First Manufacturing Method)

First, with reference to FIGS. 6A to 6E, a first method for manufacturing the light emitting element 100 according to the present embodiment will be described. FIGS. 6A to 6E are schematic cross-sectional views for explaining steps of the first manufacturing method.

Figure 6A:
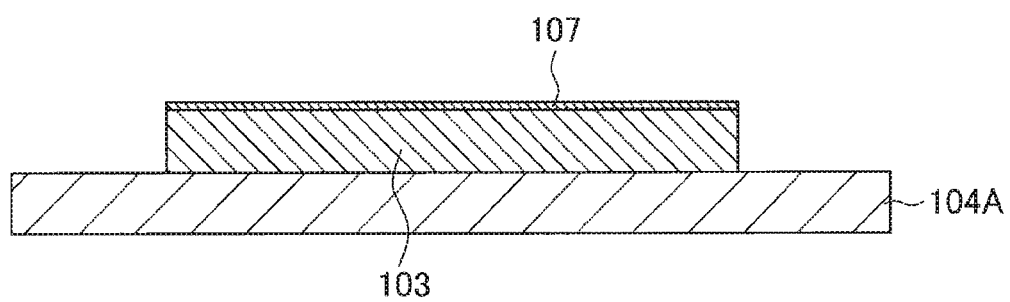
FIG. 6A is a schematic cross-sectional view illustrating one step of a first manufacturing method.

First, as illustrated in FIG. 6A, the reflector 103 is formed on an insulating layer 104A, and a stopper film 107 is formed on the reflector 103.

Specifically, the insulating layer 104A containing $SiO_2$ is formed on a semiconductor substrate such as silicon (Si) by a chemical vapor deposition (CVD) method or the like. Subsequently, the reflector 103 containing aluminum (Al) or an aluminum alloy is patterned and formed on the insulating layer 104A by a sputtering method or the like. Thereafter, the stopper film 107 containing SiN is patterned and formed on the reflector 103 by a CVD method or the like. Note that the stopper film 107 is a film for securing a selection ratio at the time of planarization in a later stage.

Figure 6B:
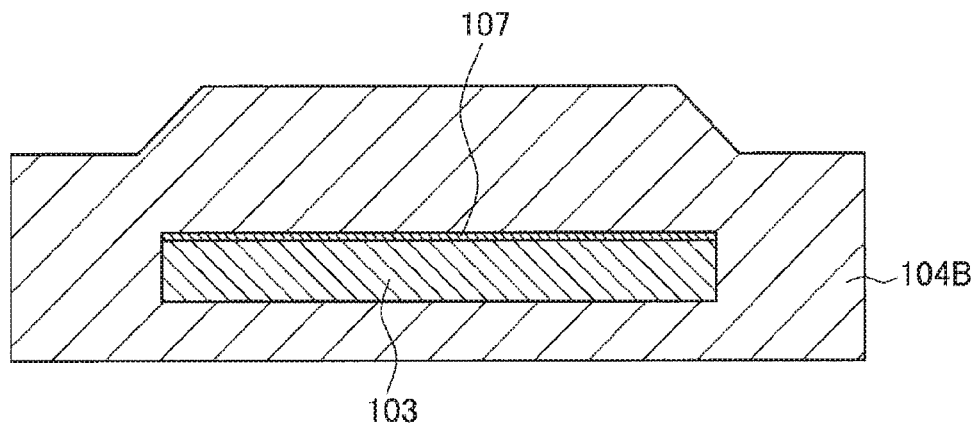
FIG. 6B is a schematic cross sectional view illustrating one step of the first manufacturing method.

Next, as illustrated in FIG. 6B, an insulating layer 104B containing $SiO_2$ is further formed so as to embed the laminate containing the reflector 103 and the stopper film 107 by a CVD method or the like.

Figure 6C:
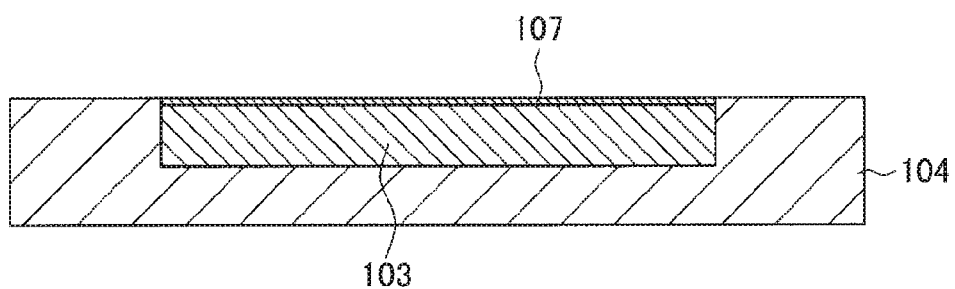
FIG. 6C is a schematic cross sectional view illustrating one step of the first manufacturing method.

Subsequently, as illustrated in FIG. 6C, the insulating layer 104 is planarized by a chemical mechanical polish (CMP) method or the like. Note that planarization of the insulating layer 104 is performed until the stopper film 107 is exposed. The stopper film 107 is constituted by a material that can secure a selection ratio by a CMP method with respect to the insulating layer 104, and therefore an end point of the planarization can be easily detected.

Figure 6D:
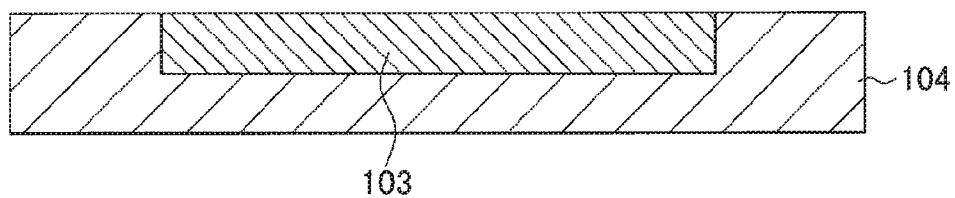
FIG. 6D is a schematic cross sectional view illustrating one step of the first manufacturing method.

Next, as illustrated in FIG. 6D, the stopper film 107 is removed by wet etching or the like, and the reflector 103 is thereby exposed. In a case where the stopper film 107 is constituted by SiN, for example, the stopper film 107 can be removed, for example, by wet etching using a phosphoric acid solution.

Figure 6E:
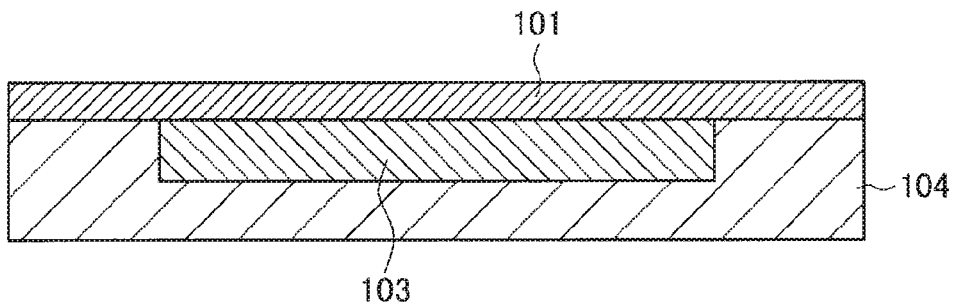
FIG. 6E is a schematic cross sectional view illustrating one step of the first manufacturing method.

Subsequently, as illustrated in FIG. 6E, the transparent electrode 101 containing a transparent conductive oxide such as ITO or IZO is formed on the exposed reflector 103 by a sputtering method or the like. Thereafter, by sequentially forming the region defining film 106, the organic light emitting layer 105, and the counter electrode 102 which have been patterned on the transparent electrode 101 by a CVD method, a sputtering method, or a vapor deposition method, the light emitting element 100 according to the present embodiment can be manufactured.

(3.2. Second Manufacturing Method)

Next, a second method for manufacturing the light emitting element 100 according to the present embodiment will be described with reference to FIGS. 7A to 7D. FIGS. 7A to 7D are schematic cross-sectional views for explaining steps of the second manufacturing method.

Figure 7A:
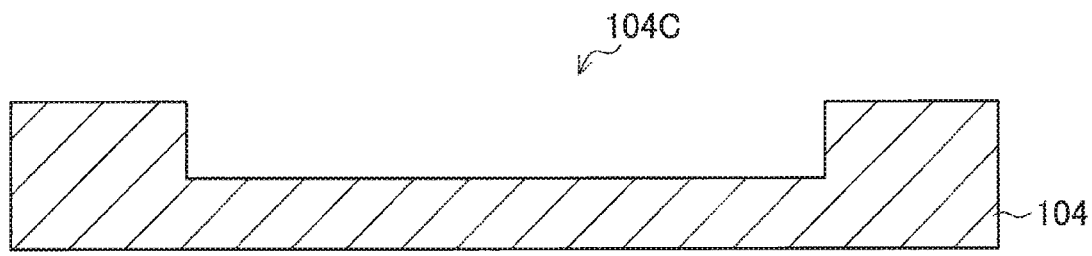
FIG. 7A is a schematic cross-sectional view illustrating one step of a second manufacturing method.

First, as illustrated in FIG. 7A, an opening 104C is formed in the insulating layer 104.

Specifically, the insulating layer 104 containing $SiO_2$ is formed on a semiconductor substrate such as silicon (Si) by a CVD method or the like. Thereafter, the opening 104C is formed in the insulating layer 104 by dry etching or the like. In a case where the insulating layer 104 contains $SiO_2$, the insulating layer 104 can be dry etched by using a fluoromethane gas.

Figure 7B:
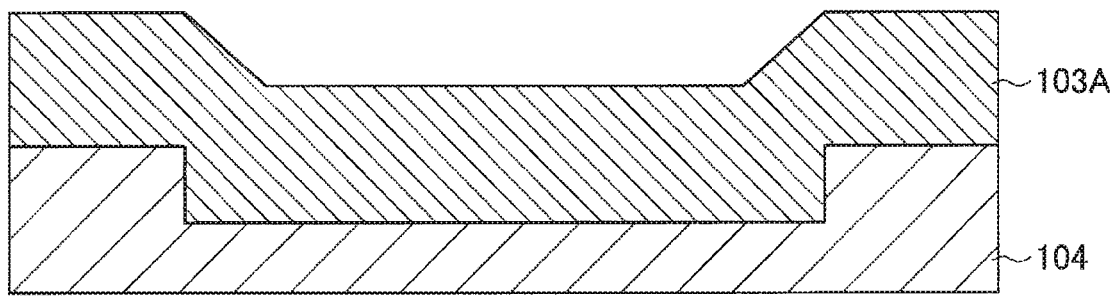
FIG. 7B is a schematic cross sectional view illustrating one step of the second manufacturing method.

Next, as illustrated in FIG. 7B, a reflector layer 103A containing aluminum (Al) or an aluminum alloy is formed so as to embed the opening 104C by a sputtering method or the like.

Figure 7C:
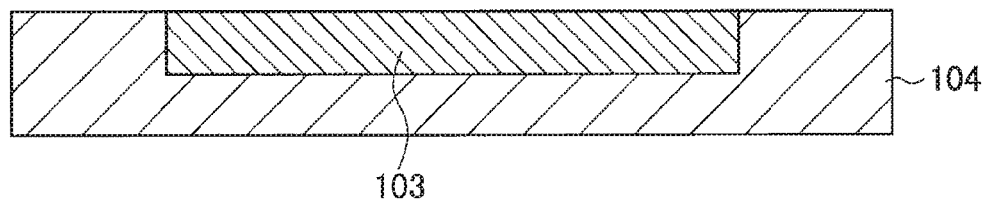
FIG. 7C is a schematic cross sectional view illustrating one step of the second manufacturing method.

Subsequently, as illustrated in FIG. 7C, the reflector layer 103A is planarized by a CMP method or the like to form the reflector 103. Note that planarization of the reflector layer 103A is performed, for example, until the insulating layer 104 is exposed.

Figure 7D:
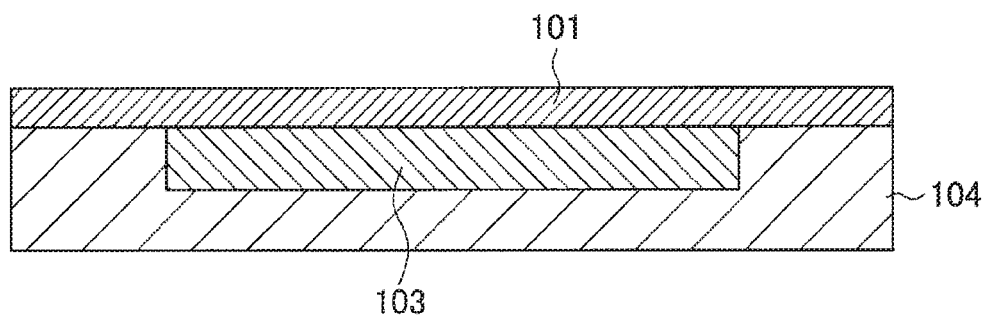
FIG. 7D is a schematic cross-sectional view illustrating a step of the second manufacturing method.

Next, as illustrated in FIG. 7D, the transparent electrode 101 containing a transparent conductive oxide such as ITO or IZO is formed on the planarized reflector 103 by a sputtering method or the like. Thereafter, by sequentially forming the region defining film 106, the organic light emitting layer 105, and the counter electrode 102 which have been patterned on the transparent electrode 101 by a CVD method, a sputtering method, or a vapor deposition method, the light emitting element 100 according to the present embodiment can be manufactured.

<4. Application Example of Light Emitting Element>

Subsequently, application examples of the light emitting element 100 according to the present embodiment will be described with reference to FIGS. 8 to 11. Each of FIGS. 8 to 11 is an external view illustrating an example of a display device or an electronic apparatus to which the light emitting element 100 according to the present embodiment can be applied.

Figure 8:
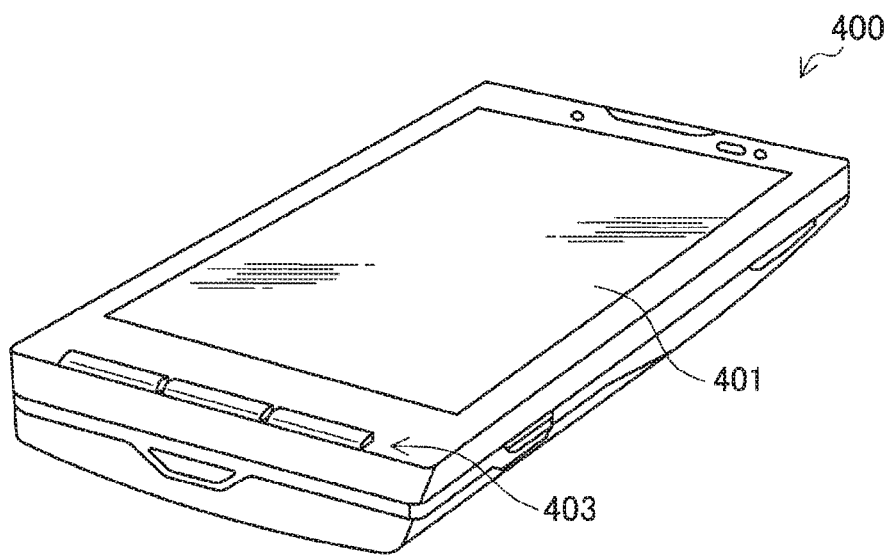
FIG. 8 is an external view illustrating an example of a display device or an electronic apparatus to which the light emitting element according to the embodiment can be applied.

For example, the light emitting element 100 according to the present embodiment can be applied to a pixel element of a display unit included in an electronic apparatus such as a smartphone. Specifically, as illustrated in FIG. 8, a smartphone 400 includes a display unit 401 that displays various types of information, and an operation unit 403 including a button or the like that receives an operation input by a user. Here, the display unit 401 may be constituted by a display device including the light emitting element 100 according to the present embodiment.

Figure 9:
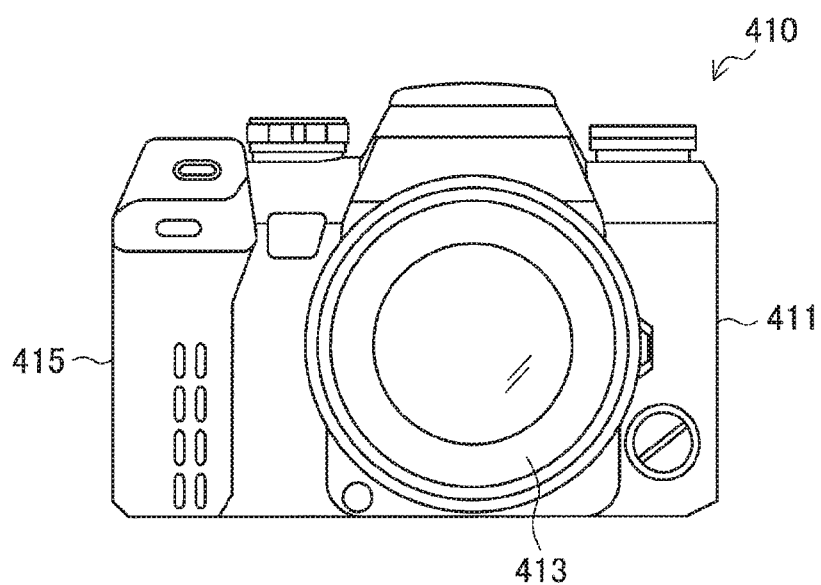
FIG. 9 is an external view illustrating another example of the display device or the electronic apparatus to which the light emitting element according to the embodiment can be applied.
Figure 10:
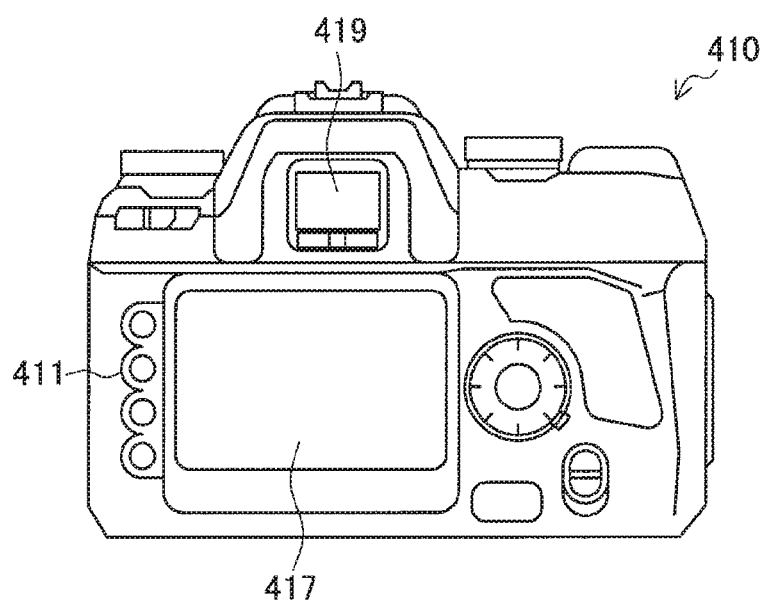
FIG. 10 is an external view illustrating another example of the display device or the electronic apparatus to which the light emitting element according to the embodiment can be applied.

Furthermore, for example, the light emitting element 100 according to the present embodiment can be applied to a pixel element of a display unit of an electronic apparatus such as a digital camera. Specifically, as illustrated in FIGS. 9 and 10, a digital camera 410 includes a main body (camera body) 411, an interchangeable lens unit 413, a grip unit 415 held by a user at the time of photographing, a monitor unit 417 that displays various types of information, and an electronic view finder (EVF) 419 that displays a through image observed by a user at the time of photographing. Note that FIG. 9 illustrates an external appearance of the digital camera 410 viewed from the front (in other words, an object side). FIG. 10 illustrates an external appearance of the digital camera 410 viewed from the rear (in other words, a photographer side). Here, each of the monitor unit 417 and the EVF 419 may be constituted by a display device including the light emitting element 100 according to the present embodiment.

Figure 11:
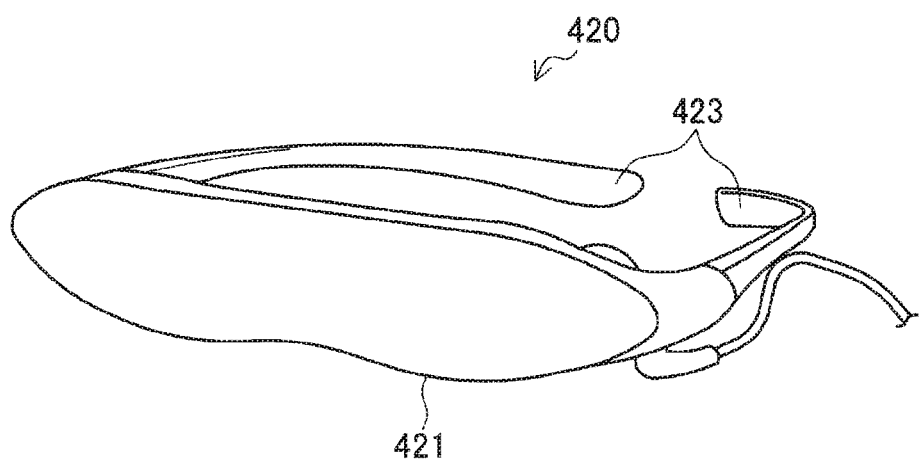
FIG. 11 is an external view illustrating another example of the display device or the electronic apparatus to which the light emitting element according to the embodiment can be applied.

Furthermore, for example, the light emitting element 100 according to the present embodiment can be applied to a pixel element of a display unit of an electronic apparatus such as a head mounted display (HMD). Specifically, as illustrated in FIG. 11, an HMD 420 includes an eyeglass type display unit 421 that displays various types of information, and an ear hooking unit 423 to be hooked on a user's ear at the time of being worn. Here, the display unit 421 may be constituted by a display device including the light emitting element 100 according to the present embodiment.

Note that the electronic apparatus to which the light emitting element 100 according to the present embodiment can be applied is not limited to the above examples. The light emitting element 100 according to the present embodiment can be applied to a display unit of an electronic apparatus in any field that performs display on the basis of an image signal input from the outside or an image signal generated internally. Examples of such an electronic apparatus include a television device, an electronic book, a personal digital assistant (PDA), a laptop personal computer, a video camera, a game device, and the like.

Hitherto, a preferable embodiment of the present disclosure has been described in detail with reference to the accompanying drawings, but the technical scope of the present disclosure is not limited to such examples. It is obvious that a person having ordinary knowledge in the technical field to which the present disclosure belongs can conceive of various change examples and modification examples within a range of the technical idea described in the claims, and it is understood that these change examples and modification examples are naturally within the technical scope of the present disclosure.

In the above, the display device and the electronic apparatus using an organic EL element as a light emitting element have been described as an embodiment of the present disclosure, but the present disclosure is not limited to such an example. The display device to be an object of the present disclosure may be any display device such as a liquid crystal display, a plasma display, or electronic paper as long as being able to achieve image display. Also in these other display devices, by forming a reflector in a smaller planar region than a planar region of a transparent electrode, an influence of abnormal light emission or the like on a chromaticity point of a light emitting element can be reduced as in the above-described embodiment.

Here, the light emitting element is a portion that emits light toward the outside in each pixel of a display device. For example, in the display device described in the above embodiment, the light emitting element corresponds to the organic light emitting layer (in other words, organic EL element) sandwiched by the transparent electrode and the counter electrode. Furthermore, in a liquid crystal display, the light emitting element corresponds to one pixel of a liquid crystal panel including a backlight. Moreover, in a plasma display, the light emitting element corresponds to one discharge cell of a plasma display panel.

Furthermore, the effects described in the present specification are merely illustrative or exemplary, and are not limiting. That is, the technique according to the present disclosure can exhibit another effect obvious to those skilled in the art from the description of the present specification together with the above effects or in place of the above effects.

Note that the following configurations are also within the technical scope of the present disclosure.

(1)

A light emitting element including:
a light emitting region formed on a plane;
a transparent electrode formed in a planar region that is larger than the light emitting region and internally includes the light emitting region;
a reflector disposed under the transparent electrode and formed in the planar region inside the light emitting region;
an organic light emitting layer disposed on the transparent electrode and formed so as to extend to the outside of the light emitting region; and
a counter electrode disposed on the organic light emitting layer and formed so as to extend to the outside of the light emitting region.

(2)

The light emitting element according to (1), in which the transparent electrode is disposed on an insulating layer in a planar shape.

(3)

The light emitting element according to (2), in which the reflector is disposed so as to be embedded in the insulating layer.

(4)

The light emitting element according to any one of (1) to (3), in which a region defining film containing an insulating material is disposed around the transparent electrode, and the region defining film has an opening in a region corresponding to the light emitting region.

(5)

The light emitting element according to (4), in which the region defining film is disposed so as to partially overlap with a top surface of the transparent electrode.

(6)

The light emitting element according to (4) or (5), in which the organic light emitting layer and the counter electrode are disposed so as to extend on the region defining film.

(7)

The light emitting element according to any one of (4) to (6), in which an open end of the region defining film is formed outside the planar region in which the reflector is disposed.

(8)

The light emitting element according to any one of (1) to (7), in which the reflector contains a metal material.

(9)

The light emitting element according to any one of (1) to (8), in which the transparent electrode contains a transparent conductive oxide.

(10)

A display device including:
a plurality of light emitting elements arranged in an array on a plane, the plurality of light emitting elements including: a plurality of light emitting regions formed apart from each other on the plane; a transparent electrode formed in a planar region that is larger than each of the light emitting regions and internally includes each of the light emitting regions; a reflector disposed under the transparent electrode and formed in the planar region inside each of the light emitting regions; an organic light emitting layer disposed on the transparent electrode and formed so as to extend to an adjacent light emitting region; and a counter electrode disposed on the organic light emitting layer and formed so as to extend to an adjacent light emitting region; and
a control unit that controls light emission of the plurality of light emitting elements.

(11)

An electronic apparatus including:
a plurality of light emitting elements arranged in an array on a plane, the plurality of light emitting elements including: a plurality of light emitting regions formed apart from each other on the plane; a transparent electrode formed in a planar region that is larger than each of the light emitting regions and internally includes each of the light emitting regions; a reflector disposed under the transparent electrode and formed in the planar region inside each of the light emitting regions; an organic light emitting layer disposed on the transparent electrode and formed so as to extend to an adjacent light emitting region; and a counter electrode disposed on the organic light emitting layer and formed so as to extend to an adjacent light emitting region; and
a control unit that controls light emission of the plurality of light emitting elements.

REFERENCE SIGNS LIST 100, 110, 120, 130 Light emitting element
101, 111, 121, 131 Transparent electrode
102, 112, 122, 132 Counter electrode
103, 113, 123, 133 Reflector
104, 114, 124, 134 Insulating layer
105, 115, 125, 135 Organic light emitting layer
106, 126 Region defining film

The invention claimed is:

1. A light emitting element comprising:
a light emitting region formed on a plane;
a transparent electrode formed in a first planar region, wherein the first planar region is larger than the light emitting region;
a reflector disposed under the transparent electrode and formed in a second planar region, wherein the second planar region is inside the light emitting region;
an organic light emitting layer disposed on the transparent electrode and formed so as to extend to an outside of the light emitting region; and
a counter electrode disposed on the organic light emitting layer and formed so as to extend to the outside of the light emitting region.

2. The light emitting element according to claim 1, wherein the transparent electrode is disposed on an insulating layer in a planar shape.

3. The light emitting element according to claim 2, wherein the reflector is disposed so as to be embedded in the insulating layer.

4. The light emitting element according to claim 1, wherein a region defining film containing an insulating material is disposed around the transparent electrode, and the region defining film has an opening in a region corresponding to the light emitting region.

5. The light emitting element according to claim 4, wherein the region defining film is disposed so as to partially overlap with a top surface of the transparent electrode.

6. The light emitting element according to claim 4, wherein the organic light emitting layer and the counter electrode are disposed so as to extend on the region defining film.

7. The light emitting element according to claim 4, wherein an open end of the region defining film is formed outside the second planar region.

8. The light emitting element according to claim 1, wherein the reflector contains a metal material.

9. The light emitting element according to claim 1, wherein the transparent electrode contains a transparent conductive oxide.

10. A display device comprising:
a plurality of light emitting elements arranged in an array on a plane, the plurality of light emitting elements including:
a plurality of light emitting regions formed apart from each other on the plane;
a transparent electrode formed in a first planar region, wherein the first planar region is larger than each of the light emitting regions;
a reflector disposed under the transparent electrode and formed in a second planar region, wherein the second planar region is inside each of the light emitting regions;
an organic light emitting layer disposed on the transparent electrode and formed so as to extend to an adjacent light emitting region; and
a counter electrode disposed on the organic light emitting layer and formed so as to extend to an adjacent light emitting region; and
a control unit that controls light emission of the plurality of light emitting elements.

11. The display device according to claim 10, wherein the transparent electrode is disposed on an insulating layer in a planar shape.

12. The display device according to claim 11, wherein the reflector is disposed so as to be embedded in the insulating layer.

13. The display device according to claim 10, wherein a region defining film containing an insulating material is disposed around the transparent electrode, and the region defining film has an opening in a region corresponding to the light emitting region.

14. The display device according to claim 13, wherein the region defining film is disposed so as to partially overlap with a top surface of the transparent electrode.

15. The display device according to claim 13, wherein the organic light emitting layer and the counter electrode are disposed so as to extend on the region defining film.

16. The display device according to claim 13, wherein an open end of the region defining film is formed outside the second planar region.

17. An electronic apparatus comprising:
a plurality of light emitting elements arranged in an array on a plane, the plurality of light emitting elements including:
a plurality of light emitting regions formed apart from each other on the plane;
a transparent electrode formed in a first planar region, wherein the first planar region is larger than each of the light emitting regions;
a reflector disposed under the transparent electrode and formed in a second planar region, wherein the second planar region is inside each of the light emitting regions;
an organic light emitting layer disposed on the transparent electrode and formed so as to extend to an adjacent light emitting region; and
a counter electrode disposed on the organic light emitting layer and formed so as to extend to an adjacent light emitting region; and
a control unit that controls light emission of the plurality of light emitting elements.

18. The electronic apparatus according to claim 17, wherein the transparent electrode is disposed on an insulating layer in a planar shape.

19. The electronic apparatus according to claim 18, wherein the reflector is disposed so as to be embedded in the insulating layer.

20. The electronic apparatus according to claim 17, wherein a region defining film containing an insulating material is disposed around the transparent electrode, and the region defining film has an opening in a region corresponding to the light emitting region.

* * * * *